(12) United States Patent
Udagawa

(10) Patent No.: US 6,774,402 B2
(45) Date of Patent: Aug. 10, 2004

(54) PN-JUCTION TYPE COMPOUND SEMICONDUCTOR LIGHT-EMITTING DEVICE, PRODUCTION METHOD THEREOF AND WHITE LIGHT-EMITTING DIODE

(75) Inventor: Takashi Udagawa, Saitama (JP)

(73) Assignee: Showa Denko Kabushiki Kaisha, Tokyo (JP)

(*) Notice: Subject to any disclaimer, the term of this patent is extended or adjusted under 35 U.S.C. 154(b) by 0 days.

(21) Appl. No.: 10/384,666

(22) Filed: Mar. 11, 2003

(65) Prior Publication Data

US 2003/0173573 A1 Sep. 18, 2003

Related U.S. Application Data

(60) Provisional application No. 60/430,648, filed on Dec. 4, 2002.

(30) Foreign Application Priority Data

Mar. 12, 2002 (JP) .......................................... P2002-67473

(51) Int. Cl.$^7$ ............................................... H01L 29/22
(52) U.S. Cl. ........................... 257/94; 257/96; 257/190; 438/47
(58) Field of Search ............................. 257/94, 96, 97, 257/190; 438/47

(56) References Cited

U.S. PATENT DOCUMENTS 3,877,060 A * 4/1975 Shono et al. .................. 257/76

FOREIGN PATENT DOCUMENTS

| JP | 10-22525 A | | 1/1998 |
| JP | 11-289108 A | | 10/1999 |
| JP | 2000-004046 | * | 1/2000 |
| JP | 2001-168384 A | | 6/2001 |

* cited by examiner

*Primary Examiner*—Sara Crane
(74) *Attorney, Agent, or Firm*—Sughrue Mion, PLLC

(57) ABSTRACT

A pn-junction type compound semiconductor light-emitting device having a substrate formed of a crystal, a first barrier layer provided on the substrate and formed of an undoped boron phosphide-base semiconductor of first conduction type, and a light-emitting layer of a first or a second conduction type provided on the first barrier layer including a plurality of superposed constituent layers formed of group III nitride semiconductors each having a different band gap. The constituent layer of the light-emitting layer provided closest to the first barrier layer is a first light-emitting constituent layer formed of a group III nitride semiconductor containing phosphorus (P). A method for producing the semiconductor light-emitting device is also disclosed.

13 Claims, 3 Drawing Sheets

PN-JUCTION TYPE COMPOUND SEMICONDUCTOR LIGHT-EMITTING DEVICE, PRODUCTION METHOD THEREOF AND WHITE LIGHT-EMITTING DIODE

CROSS-REFERENCE TO RELATED-APPLICATIONS

This application claims benefit of Provisional Application No. 60/430,648, filed Dec. 4, 2002, incorporated herein by reference, under 35 U.S.C. § 111(b) pursuant to 35 U.S.C. § 119(e) (1).

BACKGROUND OF THE INVENTION

1. Field of the Invention

The present invention relates to a pn junction type compound semiconductor light-emitting device. Specifically, the present invention relates to a pn-junction type compound semiconductor light-emitting device for multi-color light emission, where a light-emitting layer emitting multi-wavelength light is constructed by superposing a plurality of constituent layers.

2. Description of the Related Art

Group III nitride semiconductors such as gallium indium nitride ($Ga_XIn_{1-X}N$: $0 \leq X \leq 1$) have been heretofore used as a constituent material of a light-emitting layer for emitting short wavelength light such as blue light in a light-emitting diode (LED) (see, JP-B-55-3834 (the term "JP-B" as used herein means an "examined Japanese patent publication")). The band gap of the $Ga_XIn_{1-X}N$ ($0 \leq X \leq 1$) is known to non-linearly and abruptly change in correspondence with the gallium (Ga) composition ratio (=X) or indium composition ratio (=1−X) (see, JP-B-55-3834 supra). For example, in a hexagonal wurtzite crystal-structure $Ga_XIn_{1-X}N$, the band gap at room temperature decreases from about 3.4 electron volt (unit: eV) of gallium nitride (GaN) to about 2.9 eV when the indium composition ratio is adjusted to 0.2 (see, JP-B-55-3834 supra). As such, the $Ga_XIn_{1-X}N$ ($0 \leq X \leq 1$) is advantageous in that the light emission wavelength can be changed by slightly changing the indium composition ratio (=1−X).

As for conventional multi-color light-emitting devices, a technique where a light-emitting layer giving multi-wavelength light is constructed from a plurality of gallium indium nitride ($Ga_XIn_{1-X}N$: $0 \leq X \leq 1$) layers having different indium compositions (=1−X) is disclosed. For example, JP-A-2001-168384 (the term "JP-A" as used herein means an "unexamined published Japanese patent application") (published on Jun. 22, 2001) discloses a technique where a light-emitting layer giving multi-wavelength light is constructed from three $Ga_XIn_{1-X}N$ ($0 \leq X \leq 1$) well layers different from each other in indium (In) composition. Furthermore, for example, in JP-A-11-289108 (published on Oct. 19, 1999), an LED emitting two-wavelength light is constructed by superposing two $Ga_XIn_{1-X}N$ ($0 \leq X \leq 1$) layers having different indium compositions. A multi-wavelength LED having a light-emitting layer constructed by superposing a plurality of $Ga_XIn_{1-X}N$ ($0 \leq X \leq 1$) layers having different indium compositions is also described in JP-A-10-22525 (published on Jan. 23, 1998).

In conventional multi-color light-emitting devices having a light-emitting layer emitting multi-wavelength light with different light emission wavelengths, a pn-junction type hetero-junction structure light-emitting part is constructed. Particularly, for increasing the light emission intensity, the light-emitting part is constructed to have a double hetero (DH) structure (see, Iwao Teramoto, *Handotai Device Gairon* (*Introduction of Semiconductor Device*), 1st ed., pp. 124–125, Baifukan (Mar. 30, 1995)). The light-emitting part having a double hetero-junction structure is obtained using a junction structure of a light-emitting layer with n-type or p-type cladding layers sandwiching the light-emitting layer. In conventional multi-color light-emitting devices, each of the cladding layers sandwiching the $Ga_XIn_{1-X}N$ ($0 \leq X \leq 1$) light-emitting layer is generally composed of n-type or p-type aluminum gallium nitride ($Al_XGa_{1-X}N$: $0 \leq X \leq 1$) (see, (1) JP-A-2001-168384, (2) JP-A-11-289108 and (3) JP-A-10-22525, all cited above).

However, a low-resistance aluminum gallium indium nitride ($Al_\alpha Ga_\beta In_\gamma N$: $0 \leq \alpha \leq 1$, $0 \leq \beta \leq 1$, $0 \leq \gamma \leq 1$ and $\alpha+\beta+\gamma=1$) having a p-type conduction cannot be readily formed due to the non-degenerated valence band structure peculiar to the wurtzite-structure crystal (see, Toshiaki Ikoma and Hideaki Ikoma, *Kagobutsu Handotai no Kiso Bussei Nyumon* (*Guide for Basic Physical Properties of Compound Semiconductor*), 1st ed., page 17, Baifukan (Sep. 10, 1991)). According to conventional techniques, in order to obtain a p-type group III nitride semiconductor layer having low resistance, it is necessary to form a group III nitride semiconductor layer by intentionally adding (doping) a p-type impurity such as group II element and then, annealing the layer to eliminate a hydrogen atom (proton) therefrom (see, JP-A-5-183189).

Furthermore, even if the low-resistance $Al_\alpha Ga_\beta In_\gamma N$ ($0 \leq \alpha \leq 1$, $0 \leq \beta \leq 1$, $0 \leq \gamma \leq 1$ and $\alpha+\beta+\gamma=1$) layer is obtained through cumbersome annealing or the like, when the layer is used as a barrier layer, the order of stacking $Ga_XIn_{1-X}N$ ($0 \leq X \leq 1$) layers constituting the light-emitting layer is limited. For example, in constructing a light-emitting layer for multi-wavelength light emission by superposing three $Ga_XIn_{1-X}N$ layers each having different band gaps, namely, different light emission wavelengths, a $Ga_XIn_{1-X}N$ layer having the smallest band gap of light emission with the longest wavelength must be disposed in the middle of three layers (see, JP-A-2001-168384 supra). This is necessary so that the radiation recombination of a hole and an electron injected to emit light can be generated on average in each layer. More particularly, this is because in group III nitride semiconductors such as $Al_\alpha Ga_\beta In_\gamma N$ ($0 \leq \alpha \leq 1$, $0 \leq \beta \leq 1$, $0 \leq \gamma \leq 1$ and $\alpha+\beta+\gamma=1$), the diffusion length (this corresponds to mobility) of a hole is about one order of magnitude smaller than that of an electron.

In other words, the problems in conventional techniques, where barrier layers sandwiching a light-emitting layer having a multilayer structure comprising a plurality of $Ga_XIn_{1-X}N$ ($0 \leq X \leq 1$) layers emitting multi-wavelength light each is constructed from $Al_\alpha Ga_\beta In_\gamma N$ ($0 \leq \alpha \leq 1$, $0 \leq \beta \leq 1$, $0 \leq \gamma \leq 1$ and $\alpha+\beta+\gamma=1$), are that (1) a low-resistance p-type conductive layer suitable as a barrier layer cannot be readily obtained and (2) due to a large difference in the diffusion length between a hole and an electron, the order of stacking of constituent layers of the light-emitting layer is limited.

SUMMARY OF THE INVENTION

The present invention has been made in consideration of the above problems of the prior art. It is therefore an object of the present invention to provide a compound semiconductor light-emitting device having a pn-junction type hetero-junction structure light-emitting part, where (A) a p-type low-resistance layer and a n-type low-resistance layer can both be readily constructed without the need for a cumbersome post-process, and (B) the barrier layer is composed of a compound semiconductor material having no large difference in mobility between holes and electrons, thereby facilitating construction of the light-emitting part.

More specifically, the above object of the present invention has been achieved by providing the following:

(1) a pn-junction type compound semiconductor light-emitting device comprising a substrate composed of a crystal, a first barrier layer provided on the substrate and composed of an undoped boron phosphide-base semiconductor of a first conduction type, and a light-emitting layer of a first or a second conduction type provided on the first barrier layer and comprising a plurality of superposed constituent layers composed of group III nitride semiconductors each having a different band gap, wherein the constituent layer of the light-emitting layer provided closest to the first barrier layer is a first light-emitting constituent layer composed of a group III nitride semiconductor containing phosphorus (P);

(2) the pn-junction type compound semiconductor light-emitting device as described in (1) above, wherein the substrate is a silicon (Si) single crystal substrate;

(3) the pn-junction type compound semiconductor light-emitting device as described in (1) or (2) above, wherein each of the constituent layers of the light-emitting layer is composed of gallium indium phosphide nitride ($Ga_XIn_{1-X}P_{1-Y}N_Y$: $0 \leq X \leq 1$ and $0<Y<1$) or gallium phosphide nitride ($GaP_{1-Y}N_Y$: $0<Y<1$);

(4) the pn-junction type compound semiconductor light-emitting device as described in any one of (1) to (3) above, wherein the first barrier layer has a band gap larger than that of any of the plurality of light-emitting constituent layers constituting the light-emitting layer by at least 0.1 eV or more;

(5) the pn-junction type compound semiconductor light-emitting device as described in any one of (1) to (4) above, wherein an intermediate layer composed of a group III nitride semiconductor is formed on the surface of the first barrier layer and the first light-emitting constituent layer is joined to the intermediate layer;

(6) the pn-junction type compound semiconductor light-emitting device as described in (5) above, wherein the intermediate layer is composed of a group III nitride semiconductor having a band gap larger than that of the group III nitride semiconductor of the first light-emitting constituent layer;

(7) the pn junction type compound semiconductor light-emitting device as described in (5) or (6) above, wherein the intermediate layer is composed of a group III nitride semiconductor comprising an element constituting the group III nitride semiconductor of the first light-emitting constituent layer;

(8) the pn-junction type compound semiconductor light-emitting device as described in any one of (1) to (7) above, wherein a second barrier layer composed of an undoped boron phosphide-based semiconductor of second conduction type is provided on the surface of the uppermost light-emitting constituent layer of the light-emitting layer;

(9) the pn-junction type compound semiconductor light-emitting device as described in (8) above, wherein the uppermost light-emitting constituent layer of the light-emitting layer is composed of a phosphorus (P)-containing group III nitride semiconductor of first or second conduction type;

(10) a method for producing a pn-junction type compound semiconductor light-emitting device, which comprises forming a first barrier layer composed of an undoped boron phosphide-base semiconductor of first conduction type on a substrate composed of a crystal, and further forming, on the first barrier layer, a light-emitting layer of first or second conduction type and comprising a plurality of superposed constituent layers each composed of group III nitride semiconductors having different band gaps, wherein the constituent layer of the light-emitting layer provided closest to the first barrier layer is a first light-emitting constituent layer composed of a group III nitride semiconductor containing phosphorus (P);

(11) the method for producing a pn-junction type compound semiconductor light-emitting device as described in (10) above, which comprises forming an intermediate layer composed of a group III nitride semiconductor on the surface of the first barrier layer, and joining the first light-emitting constituent layer to the intermediate layer;

(12) the method for producing a pn-junction type compound semiconductor light-emitting device as described in (10) or (11) above, which comprises forming a second barrier layer composed of an undoped boron phosphide-base semiconductor of second conduction type on the surface of uppermost light-emitting constituent layer of the light-emitting layer; and

(13) a white light-emitting diode comprising the pn-junction type compound semiconductor light-emitting device described in any one of (1) to (9) above.

BRIEF DESCRIPTION OF OF THE DRAWINGS

DETAILED DESCRIPTION OF THE INVENTION

Figure 1:
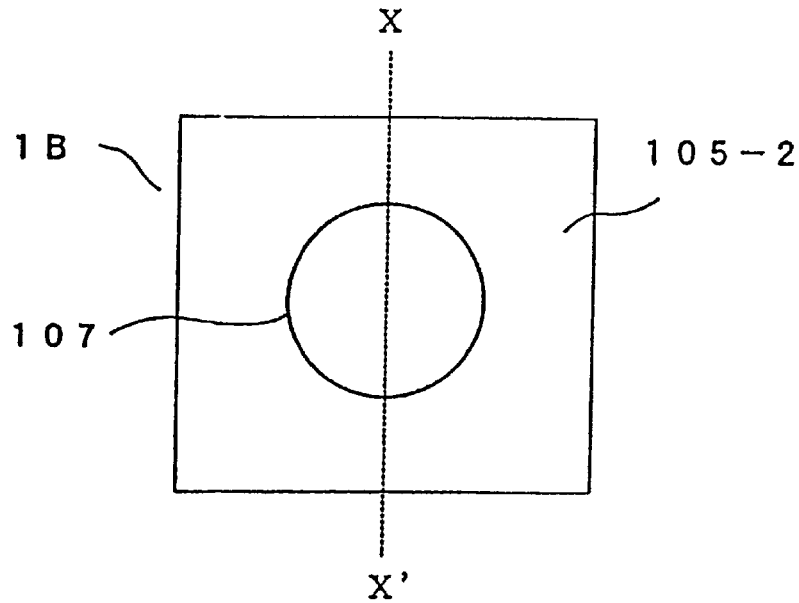
FIG. 1 is a schematic plan view of an LED according to Example 1 of the present invention.

In a first embodiment of the present invention, various crystals can be used as the substrate. For example, a group IV semiconductor single crystal such as n-type or p-type electrically conducting silicon (Si) or silicon carbide (SiC), or a group III–V compound semiconductor single crystal such as gallium phosphide (GaP) can be used as the substrate. The crystal plane on the surface of the substrate is not particularly limited but this is usually {100}, {110} or {111} crystal plane and in the case of a hexagonal crystal, {0001} or {11–21} crystal plane. A single crystal of which surface is a crystal plane inclined at an angle of several degrees from those crystal planes having a low Miller index can also be used as the substrate. An insulating α-alumina (α-$Al_2O_3$) single crystal or a perovskite crystal-structure oxide single crystal may be used as the substrate. When an electrically conducting single crystal is used as the substrate, an ohmic electrode having either positive or negative polarity can be advantageously provided as a back surface electrode on the back surface of the substrate. This enables easy fabrication of a light-emitting device such as an LED. When an electrically conducting single crystal is used as the substrate, the conduction type of the single crystal may be either n-type or p-type. A low-specific resistance (resistivity) electrically conducting single crystal substrate having a resistivity of 1 mΩ·cm or less enables fabrication of an LED having a low forward voltage (so-called Vf). Also, due to its excellent heat radiation property, this substrate is effective in fabricating an LD having a stable oscillation.

In the present invention, the first barrier layer provided on the crystal substrate is composed of a boron phosphide-base compound semiconductor layer containing boron (B) and phosphorus (P) as constituent elements, for example, $B_\alpha Al_\beta Ga_\gamma In_{1-\alpha-\beta-\gamma} P_{1-\delta} As_\delta$ (wherein $0<\alpha \leq 1$, $0 \leq \beta < 1$, $0 \leq \gamma < 1$, $0 < \alpha+\beta+\gamma \leq 1$ and $0 \leq \delta < 1$) or $B_\alpha Al_\beta Ga_\gamma In_{1-\alpha-\beta-\gamma} P_{1-\delta} N_\delta$ (wherein $0<\alpha \leq 1$, $0 \leq \beta < 1$, $0 \leq \gamma < 1$, $0 \leq \alpha+\beta+\gamma \leq 1$ and $0 \leq \delta < 1$). The first barrier layer is arranged closer to the surface of the crystal substrate than the second barrier layer which is described later. In the present invention, the conduction type of the boron phosphide-base semiconductor layer constituting the first barrier layer is provisionally called a first conduction type. In fabricating a light-emitting device by using an electrically conducting crystal as the substrate, the conduction type of the crystal constituting the substrate is preferably of a first conduction type. For example, on an Si single crystal substrate having a p-type {111} crystal plane ({111}-Si single crystal substrate), a first barrier layer composed of a p-type boron phosphide-base semiconductor layer is provided. When a buffer layer composed of an amorphous or polycrystal is provided between the boron phosphide-base semiconductor layer having a first conduction type constituting the first barrier layer and the crystal substrate, a first barrier layer having excellent crystallinity and reduced misfit dislocation or the like can be obtained. This is because the buffer layer relaxes the lattice mismatch between the single crystal material of the substrate and the boron phosphide-base semiconductor layer of first conduction type.

The first barrier layer is preferably composed of a so-called undoped boron phosphide-base semiconductor layer where an impurity for controlling the conduction type is not intentionally added (doped). This is described by referring to, for example, boron-monophosphide (BP) which is a typical boron phosphide-base semiconductor. Depending on the growth conditions, a large amount of phosphorus (P) atom occupying the boron (B) vacancy or boron (B) atom occupying the phosphorus (P) vacancy is already present in BP even in the undoped state. The phosphorus occupying the boron vacancy acts as a donor, and the boron occupying the phosphorus vacancy acts as an acceptor. Furthermore, the donor or acceptor component relating to these vacancies can be present inside the BP layer in a large amount exceeding about $10^{19}$ cm$^{-3}$, which is sufficiently high to provide a low-resistance p-type or n-type electrically conducting layer even in an undoped state. Accordingly, the barrier layer need not be composed of a boron phosphide-base semiconductor layer doped with an n-type or p-type impurity for controlling the conduction type. When the first barrier layer is composed of an undoped boron phosphide-base semiconductor layer, a cumbersome operation of doping using a different impurity depending on the conduction type or a cumbersome conventional technique for obtaining a low-resistance p-type layer, such as annealing, is not necessary, and this is advantageous in that a low-resistance electrically conducting first barrier layer can be readily obtained.

The first barrier layer preferably has a band gap larger than any of the plurality of layers constituting the light-emitting layer, and is preferably composed of a boron phosphide-base semiconductor layer having a band gap larger by at least 0.1 eV or more, preferably 0.2 eV or more, than that of the light-emitting constituent layers. The first barrier layer is more preferably composed of a boron phosphide-base semiconductor layer having a band gap larger by about 0.3 to 0.4 eV than the maximum band gap of the light-emitting constituent layers. In particular, a boron phosphide-base semiconductor layer having a band gap of about 2.8 eV to about 6.0 eV or less can be used as the first barrier layer. For example, according to a metal organic chemical vapor deposition (MOCVD) method, a boron monophosphide (BP) layer having a band gap of 3.0±0.2 eV at room temperature can be formed at a temperature of 750 to 1,200° C. by appropriately setting the concentration ratio (so-called V/III ratio) of constituent element sources supplied to the MOCVD growth reaction system and by setting the growth rate, for example, to 2 to 30 nm/min. The preferable thickness of the boron phosphide-based semiconductor layer of first conduction type serving as the first barrier layer is from more than about 50 nm to 3,000 nm. The preferabable range of carrier concentration is from about $7\times10^{17}$ to about $1\times10^{20}$ cm$^{-3}$. In the boron phosphide-base semiconductor layer, the carrier is present in a high concentration of approximately from $10^{19}$ to $10^{20}$ cm$^{-3}$ even in the undoped state. Thus, an electrically conducting layer having a low resistance on the order of several mΩ·cm that can serve as the barrier layer is readily obtained.

A light-emitting layer having a plurality of superposed constituent layers each of different band gap is stacked on the first barrier layer of first conductive type. The constituent layers constituting the light-emitting layer can each be composed of a group III nitride semiconductor layer such as gallium indium nitride ($Ga_x In_{1-x}N$: $0 \leq X \leq 1$) or gallium phosphide nitride ($GaP_{1-Y}N_Y$: $0<Y<1$). The band gap of $GaP_{1-Y}N_Y$ ($0<Y<1$) non-linearly and abruptly changes in correspondence with a slight change in nitrogen composition (=Y) or phosphorus composition (=1−Y), similar to $Ga_x In_{1-x}N$ ($0 \leq X \leq 1$) (see, Appl. Phys. Lett., pp. 2540–2542, 60

(1992)). Therefore, $GaP_{1-Y}N_Y$ ($0<Y<1$) can be used as a constituent layer of the light-emitting layer to emit light having a relatively long wavelength. The light-emitting layer can also be constructed by superposing constituent layers each composed of group III nitride semiconductor materials different from each other. For example, the light-emitting layer can be constructed by superposing three constituent layers composed of group III nitride semiconductor materials different from each other. That is, gallium nitride (GaN), gallium indium nitride mixed crystal ($Ga_XIn_{1-X}N$: in this case, $0 \leq X<1$) and gallium phosphide nitride ($GaP_{1-Y}N_Y$: $0<Y<1$). The number of layers constituting the light-emitting layer is not particularly limited, but the number of the constituent layers is preferably about 3 at most, because light emission having a desired color is generally obtained by mixing three colors. The conduction type of each constituent layer must be assimilated to either a first or a second conduction type. When a light-emitting layer of a second conduction type having constituent layers of a second conduction type is joined to the first barrier layer of a first conduction type, a pn-junction type single hetero (SH) structure light-emitting part is obtained.

The layers constituting the light-emitting layer may have different carrier concentrations. The layers constituting the light-emitting layer may also differ in thickness, but when a light-emitting constituent layer emitting light with a wavelength of low visibility has a large thickness as compared with other layers, good color rendering can be usually obtained by mixing colors. For example, in obtaining white light by mixing blue light emission and yellow light emission which are in a complementary color relationship, the thickness of the light-emitting constituent layer emitting blue light lower in visibility than the yellow light is made larger than that of the light-emitting constituent layer emitting yellow light. In an LED employing a system of penetrating light emitted to the outside in a direction opposite the single crystal substrate, a light-emitting constituent layer emitting light with the longest wavelength is preferably disposed closest to the single crystal substrate. For example, in constructing a light-emitting layer emitting white light from constituent layers respectively emitting blue light and yellow light, the constituent layer emitting yellow light is arranged in the first barrier layer side which is the substrate side. On the contrary, for example, in the case of an LED where the single crystal substrate is removed to emit light from the side of the substrate where the single crystal substrate was originally present, a light-emitting constituent layer emitting light having the longest wavelength is preferably disposed at a position most remote from the single crystal substrate.

In the layers constituting the light-emitting layer of the present invention, the constituent layer provided closest to the first barrier layer composed of a boron phosphide-base semiconductor layer of first conduction type is provisionally called a first light-emitting constituent layer. This first light-emitting constituent layer is constructed from a crystal layer particularly composed of a group III nitride semiconductor containing phosphorus (P). Examples of the phosphorus (P)-containing group III nitride semiconductor suitable as the first light-emitting constituent layer include gallium indium phosphide nitride ($Ga_XIn_{1-X}P_{1-Y}N_Y$: $0 \leq X \leq 1$ and $0<Y<1$) and gallium phosphide nitride ($GaP_{1-Y}N_Y$: $0<Y<1$). This phosphorus (P)-containing group III nitride semiconductor layer is advantageous in that the band gap, and in turn the light emission wavelength, can be varied by slightly (several %) by changing the phosphorus (P) composition. That is, a plurality of light-emitting constituent layers emitting multi-wavelength light can be provided by only slightly changing the phosphorus composition. In the case where the composition ratios of group III constituent elements gallium (Ga) and indium (In) are the same, the band gap generally decreases as the composition ratio of phosphorus (P) increases, which is advantageous in obtaining a light-emitting constituent layer of long wavelength.

The phosphorus (P)-containing first light-emitting constituent layer stacked on the first barrier layer (cladding layer) composed of a boron phosphide-base semiconductor layer has excellent surface flatness and continuity, and can therefore be effectively used, for example, as a well layer constituting a quantum well (QW) structure. In particular, when the first light-emitting constituent layer is composed of a direct transition-type semiconductor material, the first light-emitting constituent layer can be advantageously used as a well layer giving high light emission intensity. When the first light-emitting constituent layer is stacked as a well layer on the first barrier layer composed of a boron phosphide-base semiconductor layer, a light-emitting layer having a single- or multi-quantum well structure with one end there of being a well layer can be provided. In the present invention, the well layers constituting the multi-quantum well structure (MQW) are each composed of group III nitride semiconductor materials differing in band gap. The well layers may each be composed of group III nitride semiconductor materials different from one another, however, the conduction type of each well layer is in agreement with the conduction type of the first light-emitting constituent layer. The other end of the QW structure, namely, the terminal end of the QW structure, can be constructed from either a well layer or a barrier layer for a well layer. In the MQW structure where the light-emitting constituent layer and the barrier layer are superposed alternately and periodically, the barrier layer preferably has the same conduction type as the light-emitting constituent layer, and is constructed from a semiconductor layer having a band gap larger than that of the light-emitting constituent layer.

In the phosphorus (P)-containing group III nitride semiconductor layer constituting the first light-emitting constituent layer, the band gap also changes correspondingly, if the phosphorus (P) concentration within the layer increases or decreases due to diffusion or the like.

In a second embodiment of the present invention, the first light-emitting constituent layer is joined to an intermediate layer composed of a group III nitride semiconductor, and formed on the surface of the undoped boron phosphide-base semiconductor layer constituting the first barrier layer. The intermediate layer captures phosphorus (P) or boron (B) that thermally diffuses into the light-emitting layer from the boron phosphide-base semiconductor layer constituting the first barrier layer and thereby prevents an increase in the amount of phosphorus (P) or boron (B) incorporated into the light-emitting layer. Furthermore, for example, when a silicon single crystal (silicon) is used as the substrate, the intermediate layer inhibits silicon (Si), which is liberated from the substrate from intruding into the light-emitting layer and causing a change in the carrier concentration. That is, the intermediate layer prevents the band gap and carrier concentration of a light-emitting layer having a band gap suitable for emitting high-intensity light from fluctuating due to external atoms. Considering that the first barrier layer as an underlying layer of the light-emitting layer is constructed from an undoped boron phosphide-base semiconductor layer in the present invention, and the intermediate layer therefore inhibits effectively the diffusion of phosphorus (P) or boron (B), particularly phosphorus (P) of the first barrier layer into the light-emitting layer.

The thermal diffusion of phosphorus (P) becomes significant during stacking of a light-emitting layer on the undoped boron phosphide-base semiconductor layer constituting the first barrier layer in a high-temperature growth environment. Since the growth temperature of, for example, the gallium indium nitride light-emitting layer is generally from 650 to 950° C., the thickness of the intermediate layer is preferably in the order of about 20 to about 500 nm so that the concentration of phosphorus incorporated into the light-emitting layer is not increased. Furthermore, in order to prevent diffusion of an impurity from the intermediate layer itself into the inside of the light-emitting layer or the first barrier layer, the intermediate layer is most preferably formed from an undoped high-purity and phosphorus-free electrically conducting semiconductor layer, particularly a group III nitride semiconductor layer. The light-emitting layer is composed of a group III nitride semiconductor and therefore, a continuous light-emitting layer having no crack can be readily obtained when the intermediate layer is similarly composed of a group III nitride semiconductor. Furthermore, reduction in the concentration of phosphorus diffusing from the first barrier layer into the light-emitting layer can be achieved, when the intermediate layer is constructed from an electrically conducting group III nitride semiconductor layer which can be formed at a temperature lower than the growth temperature of the boron phosphide-base semiconductor layer. Specific examples of the material of the intermediate layer include aluminum gallium nitride ($Al_xGa_{1-x}N$: $0 \leq X \leq 1$).

In a third embodiment of the present invention, the intermediate layer is composed of a group III nitride semiconductor having a band gap larger than that of the group III nitride semiconductor constituting the first light-emitting constituent layer. For example, when the first light-emitting layer constituent layer is composed of $GaP_{1-Y}N_Y$ ($0<Y<1$), the intermediate layer is composed of $Al_xGa_{1-x}N$ ($0<X \leq 1$). The intermediate layer having a band gap exceeding the band gap of the first light-emitting constituent layer acts as a barrier layer for the first light-emitting constituent layer. The stacked layer structure of the intermediate layer and first light-emitting constituent layer can therefore provide a light-emitting layer having a quantum well structure with one end thereof being a barrier layer. The conduction type of the intermediate layer may be either of the first conduction type or the second conduction type, but is preferably the same as that of the first light-emitting constituent layer. When the band gap of the intermediate layer is larger than that of the first light-emitting constituent layer and smaller than that of the first barrier layer, the forward voltage (so-called Vf) of the LED is, for example, effectively reduced. Suitable examples of the structure include a case where a first light-emitting constituent layer having a band gap of 2.6 eV at room temperature is stacked on a first barrier layer composed of boron monophosphide (BP) having a band gap of 3.0 eV at room temperature via an intermediate layer composed of $Ga_xIn_{1-x}N$ having a band gap of 2.8 eV at room temperature.

When the intermediate layer serving as the underlying layer of the first light-emitting constituent layer is composed of a group III nitride semiconductor containing an element (constituent element) of the group III nitride semiconductor layer serving as the first light-emitting constituent layer, a first light-emitting constituent layer having continuity with no crack is effectively obtained. The constituent element of the first light-emitting constituent layer, contained in the intermediate layer acts as a "growth nucleus" and thereby, the film formation of the first light-emitting constituent layer can smoothly proceed.

In a fourth embodiment of the present invention, a light-emitting constituent layer composed of gallium indium phosphide nitride ($Ga_xIn_{1-x}P_{1-y}N_y$: $0 \leq X \leq 1$ and $0<Y<1$) is provided on an intermediate layer composed of gallium nitride (GaN). The light-emitting constituent layer, particularly the light-emitting layer emitting short wavelength light, is exclusively composed of a group III nitride semiconductor having a large band gap. The film formation temperature of the group III nitride semiconductor layer is a high temperature, for example, of about 700 to about 1,200° C. Therefore, the intermediate layer is suitably composed of a group III nitride semiconductor material having a high melting point, which is not denatured during film formation of the group III nitride semiconductor layer at a high temperature.

When a second barrier layer composed of an undoped boron phosphide-base semiconductor of second conduction type is provided on the surface of the light-emitting constituent layer as the uppermost layer of the light-emitting layer, the light-emitting layer is sandwiched by the first and the second barrier layers and a pn-junction type DH structure light-emitting part is provided.

In a fifth embodiment of the present invention, similar to the first barrier layer, the second barrier layer is also constructed from a boron phosphide-base semiconductor such as $B_\alpha Al_\beta Ga_\gamma In_{1-\alpha-\beta-\gamma}P_{1-\delta}As_\delta$ ($0<\alpha 1$, $0 \leq \beta<1$, $0 \leq \gamma<1$, $0<\alpha+\beta+\gamma \leq 1$ and $0 \leq \delta<1$) or $B_\alpha Al_\beta Ga_\gamma In_{1-\alpha-\beta-\gamma}P_{1-\delta}N_\delta$ ($0<\alpha \leq 1$, $0 \leq \beta<1$, $0 \leq \gamma<1$, $0<\alpha+\beta+\gamma \leq 1$ and $0 \leq \delta<1$). The second barrier layer is composed of an undoped boron phosphide-base semiconductor layer having a conduction type opposite the conduction type of the first barrier layer. For example, when the second barrier layer is composed of an undoped n-type boron phosphide-base semiconductor, the first barrier layer is p-type. The boron phosphide-base semiconductor is advantageous in that an electrically conducting semiconductor layer of a first or a second conduction type can be obtained even without intentionally adding (doping) an impurity for controlling the conduction type. Accordingly, when the second barrier layer is formed from an undoped boron phosphide-base semiconductor layer, a cumbersome doping operation where an impurity added intentionally must be varied according to conduction type can be avoided, and a low-resistance and electrically conducting second barrier layer can be readily constructed.

In providing an undoped boron phosphide-base semiconductor layer constituting the second barrier layer on the uppermost layer of light-emitting layer constructed from a group III nitride semiconductor layer, a second barrier layer having excellent continuity with no crack can be obtained when the second barrier layer is provided on the uppermost layer of the light-emitting layer composed of a phosphorus (P)-containing group III nitride semiconductor of a first or a second conduction type. The uppermost layer of the light-emitting layer means a constituent layer constituting the surface of the light-emitting layer (that is, the uppermost layer among the light-emitting constituent layers constituting the light-emitting layer).

In a sixth embodiment of the present invention, a second barrier layer composed of an undoped n-type boron phosphide (BP) layer is in contact with the uppermost layer of the light-emitting layer composed of a direct transition-type n-type $GaN_{1-Y}P_Y$. Unlike conventional group III nitride semiconductors, the mobility of electron and hole does not greatly differ in the boron phosphide (BP). In other words, both carriers are not so different in diffusion length as in the group III nitride semiconductor. The order of stacking light-emitting constituent layers is accordingly not strictly limited as in conventional techniques. However, for example, in an LED employing a system of emitting light through the second barrier layer, the uppermost layer of the light-emitting layer is preferably constructed from a light-emitting constituent layer emitting the shortest wavelength light as compared with other light-emitting constituent layers. That is, the phosphorus (P) content or phosphorus composition of the group III nitride semiconductor layer constituting the uppermost layer of the light-emitting layer must emit light of the shortest wavelength in the LED employing the above system. For example, in constructing a light-emitting layer by superposing three $GaN_{1-Y}P_Y$ ($Y=Y_1$, $Y_2$ or $Y_3$) layers having a phosphorus composition ratio (Y) of $Y_1$, $Y_2$ or $Y_3$ (provided that $0 \leq Y_1 < Y_2 < Y_3 \leq 0.15$), the uppermost layer of the light-emitting layer is constructed from a $GaN_{1-Y_1}P_{Y_1}$ layer having a largest band gap and accordingly, emitting light with the shortest wavelength.

Mode of Operations:

Phosphorus (P) contained in the first light-emitting constituent layer closest to the undoped boron phosphide-base semiconductor layer constituting the first barrier layer reduces the band gap of the group III nitride semiconductor layer constituting the first light-emitting constituent layer, and contributes to the construction of a first light-emitting constituent layer emitting light with a long wavelength.

The intermediate layer composed of a group III nitride semiconductor, which is provided between the first light-emitting constituent layer and the undoped boron phosphide-base semiconductor layer constituting the first barrier layer, captures phosphorus (P) diffusing from the boron phosphide-base semiconductor layer constituting the first barrier layer into the first light-emitting constituent layer, thereby maintaining the phosphorus (P) concentration and composition inside the light-emitting layer.

The light-emitting constituent layer composed of a phosphorus (P)-containing group III nitride semiconductor of a first or a second conduction type, which constitutes the uppermost layer of a light-emitting layer constructed by superposing a plurality of constituent layers, provides a second barrier layer composed of an undoped boron phosphide-base semiconductor of a second conduction type and having excellent continuity with no gap.

EXAMPLES

The present invention is described in further detail with reference to the following representative Examples. However, the present invention should not be construed as being limited thereto.

Example 1

The present invention is specifically described by referring to fabrication of a pn-junction type hetero structure LED having a light-emitting layer composed of two light-emitting constituent layers emitting blue light and yellow light, respectively.

Figure 2:
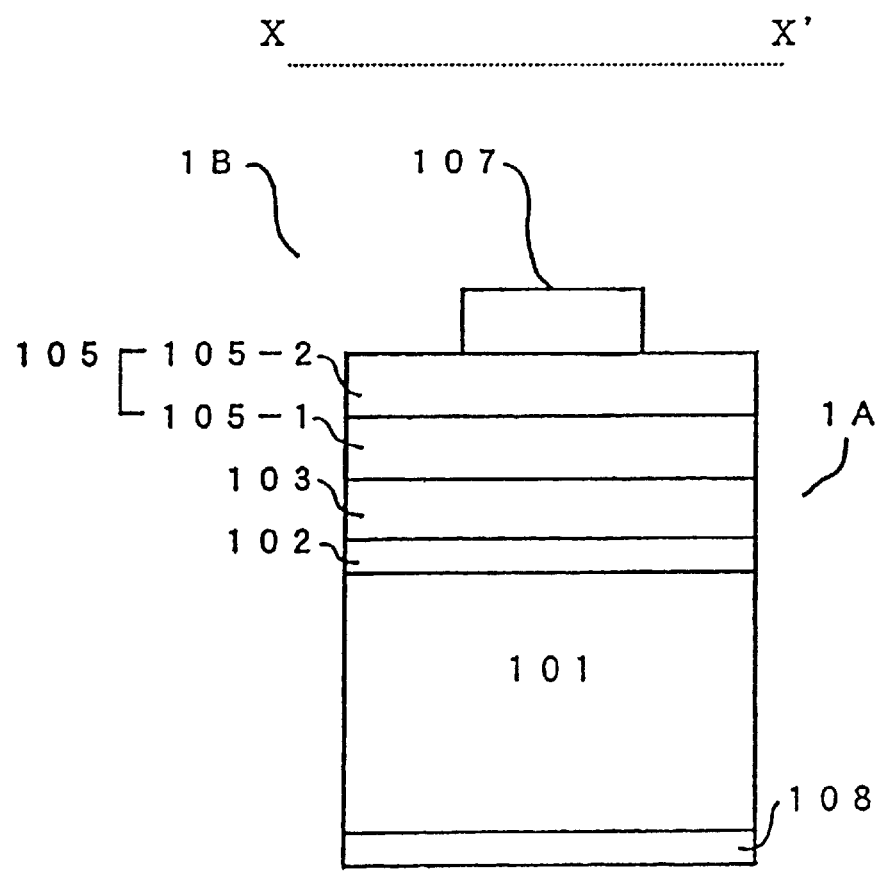
FIG. 2 is a schematic cross-sectional view of an LED cut along the broken line X–X' shown in FIG. 1.

FIG. 1 shows a schematic plan view of LED 1B according to Example 1. FIG. 2 shows a schematic cross-sectional view of LED 1B cut along the broken line X–X' of FIG. 1.

A stacked layer structure 1A for use in LED 1B was formed using a boron (B) doped p-type (111)-Si single as a substrate 101. On the substrate 101, a buffer layer 102 mainly comprising an amorphous in the as-grown state layer containing phosphorus (P) and boron (B) was deposited at a temperature of 450° C. by an atmospheric pressure triethylborane $(C_2H_5)_3B$/phosphine $(PH_3)$/hydrogen $(H_2)$ MOCVD method. The thickness of the buffer layer 102 was 5 nm.

After the completion of the film formation of the buffer layer 102, the temperature of the substrate 101 was elevated to 1,050° C. After the elevation of the temperature, a first barrier layer 103 constructed from an undoped p-type boron phosphide (BP) layer was stacked on the surface of the buffer layer 102 using the above-described MOCVD vapor phase growth method. The thickness of the p-type boron phosphide layer constituting the first barrier layer 103 was about 450 nm and the carrier concentration was about $2 \times 10^{19}$ cm$^{-3}$. The first barrier layer 103 was composed of p-type boron phosphide having a band gap of about 3.0 eV at room temperature.

After the completion of vapor phase growth of the first barrier layer 103, the temperature of the silicon single crystal substrate 101 was lowered to 800° C. while passing $PH_3$ and $H_2$ to the MOCVD growth reaction system. Thereafter, an n-type gallium indium nitride phosphide $(Ga_{0.55}In_{0.45}N_{0.95}P_{0.05})$ layer constituting a first light-emitting constituent layer 105-1 was joined to the first barrier layer 103 using an atmospheric pressure $((CH_3)_3Ga)$/trimethylindium $((CH_3)_3In)$/ammonia $(NH_3)$/$PH_3$/hydrogen $(H_2)$ MOCVD method. The phosphorus composition of the first light-emitting constituent layer 105-1 was controlled to a ratio (=0.05) capable emitting yellow band light and the layer thickness was about 68 nm. On the first light-emitting constituent layer 105-1, a second light-emitting constituent layer 105-2 of an n-type gallium indium nitride $(Ga_{0.90}In_{0.10}N)$ layer grown at 800° C. by the above-described atmospheric pressure MOCVD method was provided. The thickness of the second light-emitting constituent layer 105-2 was about 110 nm. A light-emitting layer 105 was constructed from the first and the second light-emitting constituent layers 105-1 and 105-2.

After completing formation of the stacked layer structure 1A, the phosphorus (P) atom concentration inside the light-emitting layer 105 was determined by conventional secondary ion mass spectrometry (SIMS). The average phosphorus atomic concentration inside the first light-emitting constituent layer 105-1 was determined to be about $8 \times 10^{20}$ atom/cm$^3$, and the average phosphorus atomic concentration inside the second light-emitting constituent layer 105-2 was determined to be about $4 \times 10^{19}$ atom/cm$^3$. From these results, in the first and the second light-emitting constituent layers 105-1 and 105-2, a slight increase of the phosphorus atomic concentration due to diffusion of phosphorus (P) atom from the first barrier layer 103 was detected.

At the center part on the surface of the light-emitting layer 105, a surface electrode 107 having a three-layer structure of Au/nickel (Ni)/Au was provided by disposing a thin film layer comprising gold (Au) on the surface of the light-emitting layer 105. The surface electrode 107 serving also as a pad electrode for wire bonding was a circular electrode having a diameter of about 120 μm. On almost the entire back surface of the p-type Si single crystal substrate 101, an ohmic electrode comprising a vacuum-deposited film of aluminum-antimony (Al—Sb) alloy was also disposed as a back surface electrode 108, thereby fabricating an LED 1B. The thickness of the Al—Sb vacuum-deposited film was about 2 μm. After forming the surface electrode 107 and back surface electrode 108, the Si single crystal substrate as the substrate 101 was cut to fabricate a pn-junction type hetero structure square LED 1B with a one-side length of about 350 μm, which structure allows for penetrating emission of light to the outside from the surface opposite the silicon single crystal 101.

Figure 3:
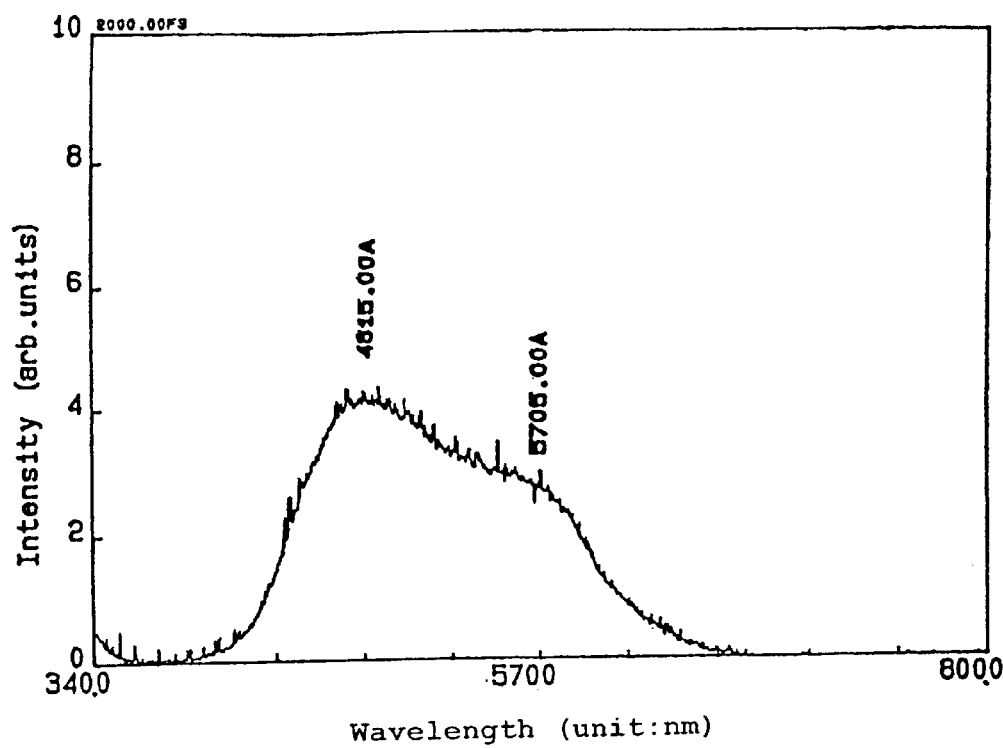
FIG. 3 is a light emission spectrum of an LED according to Example 1 of the present invention.

When an operating current of 20 mA was passed in the forward direction between the surface electrode 107 and the back surface electrode 108, yellow white light was emitted from LED 1B. As shown in FIG. 3, spectral components of the yellow white light were yellow light having a center wavelength of 570.5 nm corresponding to the light emission from the first light-emitting constituent layer 105-1, and blue light having a center wavelength of 481.5 nm corresponding to the light emission from the second light-emitting constituent layer 105-2. The brightness of the LED 1B emitting light with two different wavelengths in the form of a chip was measured using a general integrating sphere and found to be about 5 millicandela (mcd). Thus, a white light-emitting diode having high light emission intensity was provided. The forward voltage (Vf at the forward current of 20 mA) was about 2.9 V and the reverse voltage (Vr at the reverse current of 10 μA) was 5.0 V or more.

Example 2

In Example 2, the present invention is described by referring to fabrication of an LED 2B from a stacked layer structure 2A where an intermediate layer 104 is provided in contact with the first barrier layer 103 composed of the undoped p-type boron phosphide (BP) described in Example 1.

Figure 4:
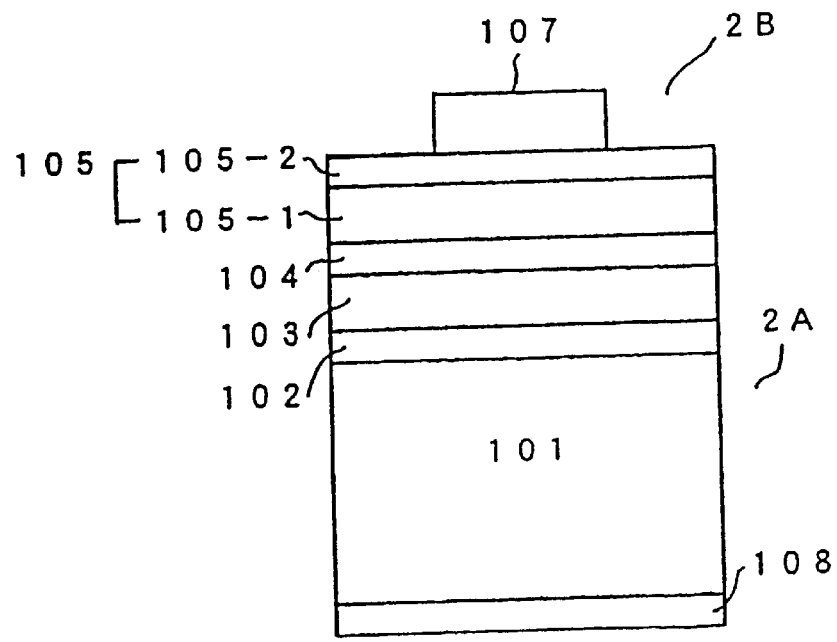
FIG. 4 is a schematic cross-sectional view of an LED according to Example 2 of the present invention.

FIG. 4 shows a schematic cross-sectional view of LED 2B according to Example 2. Constituent elements except for the intermediate layer 104 are the same as in Example 1. Accordingly, the same constituent layers shown in FIGS. 1 and 2 are indicated in FIG. 4 by the same reference numbers and their description is not repeated.

The intermediate layer 104 was constructed from an undoped n-type gallium indium nitride (Ga$_{0.95}$In$_{0.05}$N) layer. The Ga$_{0.95}$In$_{0.05}$N intermediate layer 104 having an indium (In) composition ratio of 0.05 (=5%) was vapor-phase grown at 800° C. by an atmospheric pressure (CH$_3$)$_3$Ga/(CH$_3$)$_3$In/NH$_3$/H$_2$ MOCVD method. The thickness of the intermediate layer 104 was controlled to about 25 nm. The carrier concentration of the intermediate layer 104 was estimated to be about $2 \times 10^{18}$ cm$^{-3}$. The intermediate layer 104 was composed of a wurtzite crystal-structure Ga$_{0.95}$In$_{0.05}$N having a band gap of about 3.2 eV at room temperature.

On the intermediate layer 104, a light-emitting layer 105 comprising light-emitting constituent layers 105-1 and 105-2 having the same composition as in Example 1 was joined thereto, thereby completing the formation of the stacked layer structure 2A. According to conventional secondary ion mass spectrometry (SIMS), the phosphorus (P) atomic concentration inside the intermediate layer 104 was determined to be about $4 \times 10^{19}$ atom/cm$^3$. The phosphorus atomic concentration inside the first light-emitting constituent layer 105-1 was about $8 \times 10^{18}$ atom/cm$^3$, and the phosphorus atomic concentration inside the second light-emitting constituent layer 105-2 was lower than that. Since the phosphorus atomic concentration inside the first light-emitting constituent layer 105-1 provided by directly joining to the first barrier layer 103 without providing an intermediate layer 104 as in Example 1 was as high as about $8 \times 10^{20}$ atom/cm$^3$, this revealed that the intermediate layer 104 according to the present invention is effective in capturing the phosphorus (P) atomic diffusing from the first barrier layer 103, and maintaining the phosphorus composition ratio of the first light-emitting constituent layer 105-1. The activity of capturing boron (B) or phosphorous (P) atom diffusing from the first barrier layer 103 by the intermediate layer 104 prevented the hetero-junction interface between the intermediate layer 104 and the first light-emitting constituent layer 105-1 from becoming disordered (see, Hikaridenshi Shuseki Kairo no Kiso Gijutsu (Basic Technique of Photoelectronic Integrated Circuit), 1st ed., 1st imp., pp. 371–384, compiled by Hikari Gijutsu Kyodo Kenkyusho, Ohm Sha (Aug. 20, 1989)).

The same surface electrode 107 and back surface electrode 108 as in Example 1 were formed, thereby fabricating the LED 2B. When an operating current of 20 mA was passed in the forward direction between the surface electrode 107 and the back surface electrode 108, blue white light was emitted. The spectral components of the blue white light were yellow green light having a center wavelength of 566.0 nm corresponding to the light emission from the first light-emitting constituent layer 105-1, and blue light having a center wavelength of 475.4 nm corresponding to the light emission from the second light-emitting constituent layer 105-2. The brightness of the emitting light with two different wavelengths from the LED 2B was measured in chip form using a general integrating sphere and found to be about 5 millicandela (mcd). Thus, a white light-emitting diode having high light emission intensity was provided. Furthermore, because the junction interface between the intermediate layer 104 and the first light-emitting constituent layer 105-1 was prevented from becoming disordered, good rectification characteristics were exhibited, resulting in a forward voltage (Vf at the forward current of 20 mA) of about 3.0 V and a reverse voltage (Vr at the reverse current of 10 μA) of 8.0 V or more.

Example 3

In Example 3, the present invention is described by referring to fabrication of the intermediate layer 104 from a group III nitride semiconductor material different from $Ga_{0.95}In_{0.05}N$ described in Example 2. The constituent elements other than the intermediate layer 104 are the same as in Examples 1 and 2.

Figure 5:
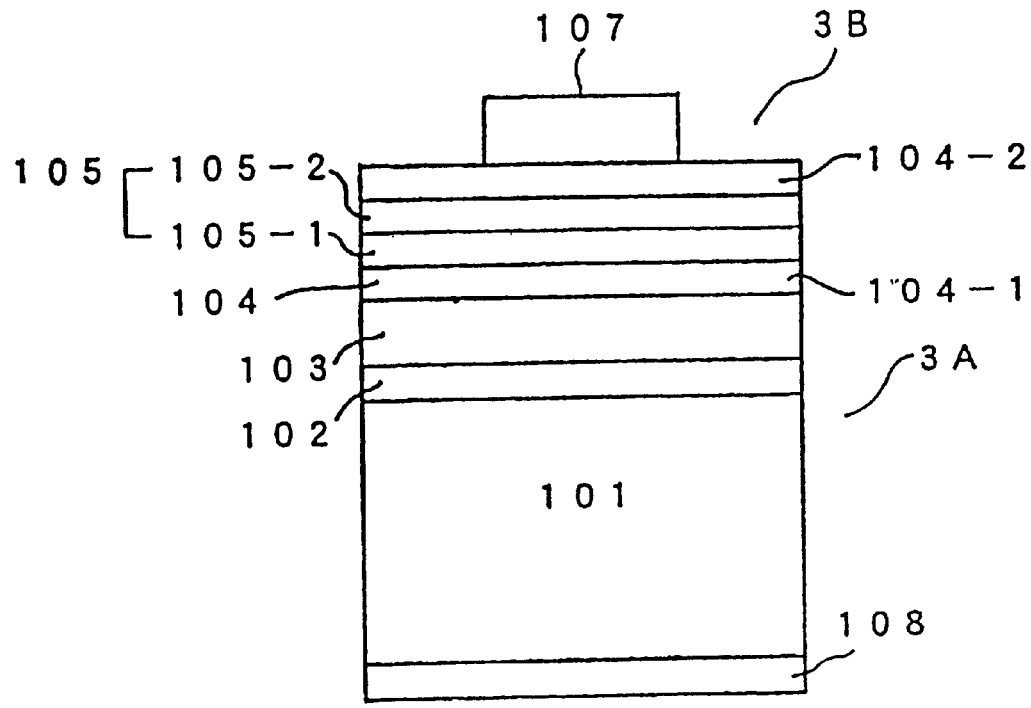
FIG. 5 is a schematic cross-sectional view of an LED according to Examples 3 and 4 of the present invention.

FIG. 5 shows a schematic cross-sectional view of LED 3B according to Example 2. In FIG. 5, the same constituent elements shown in FIGS. 1 to 3 are indicated by the same reference numbers and their description is not repeated.

The intermediate layer 104 was constructed from an undoped n-type gallium nitride (GaN) layer. The intermediate layer 104 was vapor-phase grown at the same temperature of 1,050° C. as in the case of the first barrier layer 103 by an atmospheric pressure $(CH_3)_3Ga/NH_3/H_2$ MOCVD method. The thickness of the intermediate layer 104 was set to about 30 nm. The carrier concentration of the intermediate layer 104 was estimated to be about $2\times10^{18}$ $cm^{-3}$. The intermediate layer 104 was composed of a wurtzite crystal-structure GaN having a band gap of about 3.4 eV at room temperature.

In Example 3, the intermediate layer 104 was composed of a group III nitride semiconductor having a band gap larger than the band gap in Example 2 and therefore, the intermediate layer 104 was also used as a barrier layer for the light-emitting layer 105. On the GaN layer, which is an intermediate layer 104 provided by joining to the first barrier layer 103 and which is also a lower barrier layer 104-1, two light-emitting layer constituent layers 105-1 and 105-2 having different light emission wavelengths described in Example 1 were superposed in sequence. An undoped n-type GaN layer was vapor-phase grown and joined to the second light-emitting constituent layer 105-2 as an upper barrier layer 104-2 at the same temperature of 800° C. as growth of light-emitting layer constituent layers 105-1 and 105-2 by an atmospheric pressure $(CH_3)_3Ga/NH_3/H_2$ MOCVD method. The carrier concentration of the upper barrier layer 104-2 was about $5\times10$ $cm^{-3}$ and the layer thickness was about 300 nm.

According to conventional secondary ion mass spectrometry (SIMS), the average phosphorus (P) atomic concentration inside the intermediate layer 104 was lower than that in Example 2, and determined to be about $1\times10^{18}$ atom/cm³. The average phosphorus atomic concentration inside the first light-emitting constituent layer 105-1 was about $4\times10^{18}$ atom/cm³, and the phosphorus atomic concentration inside the second light-emitting constituent layer 105-2 was equal thereto. Furthermore, according to cross-sectional TEM observation using a transmission electron microscope (TEM), good composition abruptness was confirmed to be present on the hetero-junction interface between the intermediate layer 104 (the lower barrier layer 104-1) and the first light-emitting constituent layer 105-1. The hetero-junction interface was also prevented from becoming disordered due to phosphorus (P) and boron (B) diffusing from the first barrier layer 103.

The same surface electrode 107 and back surface electrode 108 as in Example 1 were formed on the surface of the upper barrier layer 104-2 constituting the uppermost layer of the stacked layer structure 3A and on almost the entire back surface of the silicon single crystal substrate 101, respectively, thereby fabricating an LED 3B. When an operating current of 20 mA was passed in the forward direction between the surface electrode 107 and the back surface electrode 108, white light was emitted. According to a general spectrophotometric means, the spectral components of the white light were yellow green light having a center wavelength of 565.0 nm corresponding to the light emission from the first light-emitting constituent layer 105-1 and blue light having a center wavelength of 472.2 nm corresponding to the light emission from the second light-emitting constituent layer 105-2. The brightness of the LED 3B emitting light with two different wavelengths was measured in chip form using a general integrating sphere and was found to be about 5 mcd. A white light-emitting diode having high light emission intensity was thus provided. There was almost no difference in light emission intensity from that of LED 2B of Example 2. However, by virtue of the barrier layers 104-1 and 104-2 provided above and below the light-emitting layer 105, the half width (FWMH) of each spectral component was smaller by about 10 nm than that in Example 2, and an LED having excellent monochromaticity was obtained. Furthermore, because the junction interface between the intermediate layer 104 and the first light-emitting constituent layer 105-1 was prevented from becoming disordered, good rectification characteristics were exhibited, resulting in a forward voltage (Vf at the forward current of 20 mA) of about 3.0 V, and a reverse voltage (Vr at the reverse current of 10 μA) of about 9.0 V. An LED 3B additionally having a high breakdown voltage was thus obtained.

Example 4

The present invention is specifically described by reference to fabrication of an LED using an intermediate layer composed of a group III nitride semiconductor different from Example 3. The cross-sectional structure of LED according to Example 4 is the same as in FIG. 5, and only the composition of the intermediate layer 104 shown in the FIG. 5 is different.

In Example 4, the intermediate layer 104 was constructed from an undoped n-type aluminum gallium nitride mixed crystal $(Al_{0.02}Ga_{0.98}N)$ containing gallium (Ga) and nitrogen (N), which are the constituent elements of the $Ga_{0.55}In_{0.45}N_{0.95}P_{0.05}$ layer constituting the first light-emitting described in Example 1. On the first barrier layer, the intermediate layer of the present invention was vapor-phase grown at the same temperature of 1,050° C. as the first barrier layer by an atmospheric pressure trimethylaluminum $((CH_3)_3Al)/(CH_3)_3Ga/NH_3/H_2$ MOCVD method. The thickness of the intermediate layer was set to about 30 nm. The carrier concentration of the intermediate layer was estimated to be about $3 \times 10^{17}$ cm$^{-3}$. The intermediate layer was composed of a wurtzite crystal-structure $Al_{0.02}Ga_{90.8}N$ having a band gap of about 3.4 eV at room temperature.

On the intermediate layer, the same light-emitting and upper barrier layer as those described in Example 3 were provided under the conditions described in Example 3. The intermediate layer of Example 4 had a band gap larger than any intermediate layer described in Examples 1 to 3, and moreover, contained the constituent elements of the first light-emitting constituent layer. The first light-emitting constituent layer had therefore particularly excellent continuity with a flat surface. Furthermore, since the surface of the first light-emitting constituent layer was a mirror surface having excellent smoothness, the second light-emitting constituent layer superposed on the first light-emitting layer was also grown as a continuous film having excellent surface flatness. When the surface morphology was observed by a differential interference type optical microscope and a scanning electron microscope (SEM), pores or pits impairing the continuity of layer were hardly observed on the surface of the second light-emitting constituent layer.

A surface electrode and a back surface electrode were formed in the same manner as in Example 3, thereby fabricating an LED. When an operating current of 20 mA was passed in the forward direction between the surface electrode and the back surface electrode, white light was emitted similarly to Example 3. The half width of each light emission spectral component was about 10 nm smaller as compared with the case in Example 2 and approximately 20 nm similarly to the LED of Example 3. On the other hand, the brightness of the LED chip in Example 4 was about 7 mcd by reflecting the light-emitting constituent layer having an excellent surface state as a result of constructing the intermediate layer from a group III nitride semiconductor containing the constituent elements of the first light-emitting constituent layer. The brightness measured using a general integrating sphere was about 1.5 times the brightness of LED in Example 3. A white light-emitting diode having higher brightness was thus obtained. Furthermore, because the junction interface between the intermediate layer and the first light-emitting constituent layer was prevented from becoming disordered, good rectification characteristics were exhibited, resulting in a forward voltage (Vf at the forward current of 20 mA) of about 3.0 V and a reverse voltage (Vr at the reverse current of 10 $\mu$A) of about 9.0 V. An LED additionally having high breakdown voltage was thus obtained.

Example 5

In Example 5, the present invention is specifically described by reference to fabrication of a pn-junction type DH structure LED, where a second barrier layer composed of an undoped boron phosphide-base semiconductor of a second conduction type was provided on a light-emitting layer formed by superposing a plurality of light-emitting layer constituent layers emitting light with different wavelengths.

Figure 6:
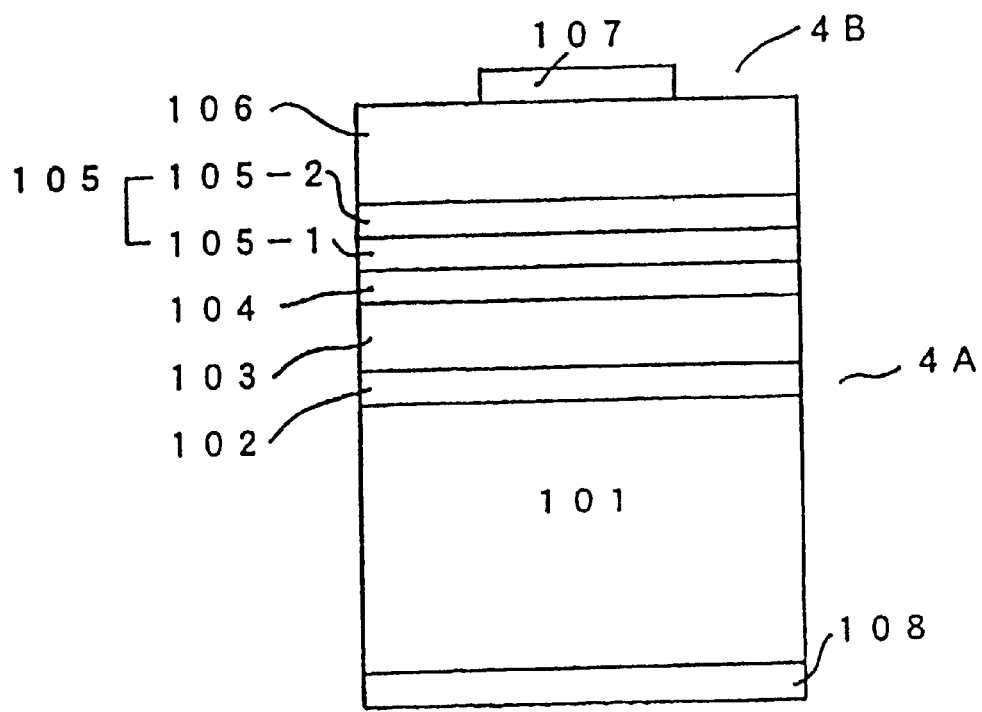
FIG. 6 is a schematic sectional view of an LED according to Examples 5 and 6 of the present invention.

FIG. 6 schematically shows a cross-sectional structure of LED 4B according to Example 5. In the LED 4B shown in FIG. 6, the same constituent elements as those in FIG. 1 are indicated by the same reference numbers and their description is not repeated.

In Example 5, after the completion of growth of the light-emitting layer 105 at 800° C. on the intermediate layer 104 as described in Example 4, the temperature of the silicon single crystal substrate 101 was elevated to 850° C. in a mixed atmosphere of NH$_3$ and H$_2$. After the temperature was elevated, a second barrier layer 106 composed of an undoped n-type boron monophosphide (BP) was joined to the light-emitting layer 105. The second barrier layer 106 was grown by an atmospheric pressure $(C_2H_5)_3B/PH_3/H_2$ MOCVD method. The second barrier layer 106 was set almost the same thickness of 450 nm as that of the first barrier layer 103. The second barrier layer 106 was also composed of an undoped boron phosphide having a band gap of about 3.0 eV at room temperature so that the second barrier layer could serve as a window layer for effectively penetrating light emitted from the light-emitting layer 105 to the outside.

After completing formation of the stacked layer structure 4A, the average phosphorus (P) atomic concentration inside the intermediate layer 104 was determined by conventional secondary ion mass spectrometry (SIMS) and found to be about $4 \times 10^8$ atom/cm$^3$. The average phosphorus (P) atomic concentration inside the first light-emitting constituent layer 105-1 was about $2 \times 10^{18}$ atom/cm$^3$, and the phosphorus atomic concentration inside the second light-emitting constituent layer 105-2 was lower than that. A cross-sectional TEM technique confirmed that by virtue of the capture of boron (B) or phosphorus (P) atom diffusing from the first barrier layer 103 by the intermediate layer 104, the heterojunction interface between the intermediate layer 104 and the first light-emitting constituent layer 105-1 was prevented from becoming disordered.

At the center part on the surface of the undoped n-type second barrier layer 106, a surface electrode 107 was disposed. The surface electrode 107 was constructed from a three-layer film of Au.Ge/Nickel (Ni)/Au in which gold-germanium (Au.Ge) alloy film was placed on the second barrier layer 106. The diameter of the circular surface electrode 107 serving also as a pad electrode was about 110 $\mu$m. On almost the entire back surface of the p-type Si single crystal substrate 101, an ohmic electrode comprising aluminum (Al) was disposed as the back surface electrode 108, thereby fabricating an LED 4B. The thickness of the Al vacuum deposited film was about 3 $\mu$m. After forming the surface electrode 107 and the back surface electrode 108, the Si single crystal 101 was cut to fabricate a square LED 4B having a one-side length of about 350 $\mu$m and having a structure for release the light to the outside from the second barrier layer 106 side in a direction opposite the silicon single crystal 101.

When an operating current of 20 mA was passed in the forward direction between the surface electrode 107 and the back surface electrode 108, blue white light was emitted from the LED 4B through the second barrier layer 106. The emission spectral component of blue light was almost the same as that shown in FIG. 3. The LED 4B of Example 5 had a pn-junction type DH hetero-junction structure light-emitting part, and the brightness measured using a general integrating sphere was therefore about 10 mcd. A white light-emitting diode having high light emission intensity was thus obtained. Furthermore, because the junction interface between the intermediate layer 104 and the first light-emitting constituent layer 105-1 was prevented from becoming disordered, good rectification characteristics were exhibited, resulting in a forward voltage (Vf at the forward current of 20 mA) of about 3.2 V, and a reverse voltage (Vr at the reverse current of 10 $\mu$A) of 5.0 V or more.

Example 6

The present invention is specifically described by reference to fabrication of a pn-junction type DH structure LED, where an undoped boron phosphide-base semiconductor layer is provided as a second barrier layer on a phosphorus (P)-containing light-emitting constituent layer as the uppermost layer of the light-emitting layer.

The LED according to Example 6 has a cross-sectional structure similarly to Example 5 as shown in FIG. 6, and differs from the LED of Example 5 only in the composition of the uppermost layer (second light-emitting constituent layer 105-2) of the light-emitting layer.

In Example 6, the second light-emitting constituent layer 105-2 was constructed from a gallium indium nitride phosphide ($Ga_{0.90}In_{0.10}N_{0.97}P_{0.03}$) layer. The second light-emitting constituent layer 105-2 was grown at the same temperature of 800° C. as the first light-emitting constituent layer 105-1 by an atmospheric pressure $(CH_3)_3Ga/(CH_3)_3In/NH_3/PH_3/H_2$ MOCVD method. The thickness of the second light-emitting constituent layer 105-2 was set to about 65 nm.

On the surface of the second light-emitting constituent layer 105-2, a second barrier layer 106 composed of an undoped n-type boron phosphide was stacked according to the technique described in Example 5. In Example 6, because the second barrier layer 106 was provided using the phosphorus (P)-containing second light-emitting constituent layer 105-2 as an underlying layer, the barrier layer thus obtained was particularly excellent in the surface smoothness. Observing the surface by SEM, pores or pits were scarcely seen and the second barrier layer 106 was confirmed to be a continuous layer. A surface electrode 107 and a back surface electrode 108 were provided thereafter in the same construction as in Example 5, thereby fabricating an LED.

When an operating current of 20 mA was passed in the forward direction between the surface electrode 107 and the back surface electrode 108, blue white light was emitted from the LED mainly through the second barrier layer 106. The emission spectral component of blue light was almost the same as that shown in FIG. 3. The brightness of the LED measured using a general integrating sphere was about 10 mcd. A white light-emitting diode having high light emission intensity was thus obtained. Furthermore, the forward voltage (Vf at the forward current of 20 mA) was about 3.0 V and the reverse voltage (Vr at the reverse current of 10 $\mu$A) was 7.0 V or more. This is because the junction interface between the intermediate layer 104 and the first light-emitting constituent layer 105-1 was prevented from becoming disordered, and the second barrier layer 106 was constructed from an undoped n-type boron phosphide layer having excellent continuity. An LED exhibiting a pn-junction property superior to the LED of Example 5 was thus obtained.

Effects of the Invention:

The present invention, provides a pn-junction type compound semiconductor light-emitting device comprising a substrate composed of a crystal, a first barrier layer provided on the substrate and composed of an undoped boron phosphide-base semiconductor of a first conduction type, and a light-emitting layer of a first or a second conduction type provided on the first barrier layer and comprising a plurality of superposed constituent layers composed of group III nitride semiconductors each having a different band gap. The constituent layer of the light-emitting layer provided closest to the first barrier layer is a first light-emitting constituent layer composed of a phosphorus (P)-containing group III nitride semiconductor of a first or a second conduction type. Thus, a light-emitting constituent layer emitting light with a relatively long wavelength, such as yellow band light, can be readily constructed, and a pn-junction type compound semiconductor light-emitting device emitting multi-wavelength light can be readily provided.

According to the present invention, the first light-emitting constituent layer is joined to an intermediate layer composed of a group III nitride semiconductor and formed on the surface of the first barrier layer composed of an undoped boron phosphide-base semiconductor layer. As a result, the first light-emitting constituent layer can be maintained to have a desired phosphorus composition ratio as a result of the intermediate layer capturing phosphorus thermally diffusing from the first barrier layer into the first light-emitting constituent layer. A pn-junction type compound semiconductor light-emitting device having a stabilized light emission wavelength can therefore be obtained.

In addition, according to the present invention, the intermediate layer is composed of particularly a group III nitride semiconductor having a band gap larger than that of the group III nitride semiconductor constituting the first light-emitting constituent layer. Thus, a light-emitting layer having a quantum well structure using the intermediate layer as the barrier layer can be readily constructed, and a pn-junction type compound semiconductor light-emitting device emitting multi-wavelength light from mixing of light emission components each having excellent monochromaticity can be provided.

Furthermore, according to the present invention, the intermediate layer is composed particularly of a group III nitride semiconductor containing a constituent element of the group III nitride semiconductor layer constituting the first light-emitting constituent layer. Thus, a first light-emitting constituent layer having excellent surface flatness and continuity can be obtained, and a pn-junction type compound semiconductor light-emitting device reflecting good pn-junction property, for example, having excellent forward voltage or reverse voltage, can be provided.

Furthermore, according to the present invention, a second barrier layer composed of an undoped boron phosphide-base semiconductor layer of second conduction type is provided on the surface of the uppermost layer of the light-emitting layer to construct a double hetero-junction structure light-emitting part. Thus, a pn-junction type compound semiconductor multi-color light-emitting device having excellent light emission intensity can be provided.

Furthermore, according to the present invention, the light-emitting constituent layer as the uppermost layer of the light-emitting layer is composed of a phosphorus-containing group III nitride semiconductor of a second conduction type. Thus, the second barrier layer can be formed from an undoped boron phosphide-base semiconductor layer having excellent continuity, and for example, a pn-junction type double hetero structure compound semiconductor multi-color light-emitting device having a low forward voltage and high light emission intensity can therefore be provided.

While the invention has been described in detail and with reference to specific embodiments thereof, it will be apparent to one skilled in the art that various changes and modifications can be made therein without departing from the spirit and scope thereof.

This application is based on Japanese Patent Application No. P2002-67473 filed Mar. 12, 2002, incorporated herein by reference in its entirety.

What is claimed is:

1. A pn-junction type compound semiconductor light-emitting device comprising a substrate composed of a crystal, a first barrier layer provided on the substrate and composed of an undoped boron phosphide-base semiconductor of a first conduction type, and a light-emitting layer of a first or a second conduction type provided on the first barrier layer comprising a plurality of superposed constituent layers composed of group III nitride semiconductors each having a different band gap, wherein the constituent layer of the light-emitting layer provided closest to the first barrier layer is a first light-emitting constituent layer composed of a group III nitride semiconductor containing phosphorus (P).

2. The pn-junction type compound semiconductor light-emitting device as claimed in claim 1, wherein the substrate is a silicon (Si) single crystal substrate.

3. The pn-junction type compound semiconductor light-emitting device as claimed in claim 1, wherein each of the constituent layers of the light-emitting layer is composed of gallium indium phosphide nitride ($Ga_XIn_{1-X}P_{1-Y}N_Y$: $0 \leq X \leq 1$ and $0 < Y < 1$) or gallium phosphide nitride ($GaP_{1-Y}N_Y$: $0 < Y < 1$).

4. The pn-junction type compound semiconductor light-emitting device as claimed in claim 1, wherein the first barrier layer has a band gap larger than that of any of the light-emitting constituent layers constituting the light-emitting layer by at least 0.1 eV or more.

5. The pn-junction type compound semiconductor light-emitting device as claimed in claim 1, wherein an intermediate layer composed of a group III nitride semiconductor is formed on the surface of the first barrier layer and the first light-emitting constituent layer is joined to the intermediate layer.

6. The pn-junction type compound semiconductor light-emitting device as claimed in claim 5, wherein the intermediate layer is composed of a group III nitride semiconductor having a band gap larger than that of the group III nitride semiconductor of the first light-emitting constituent layer.

7. The pn-junction type compound semiconductor light-emitting device as claimed in claim 5, wherein the intermediate layer is composed of a group III nitride semiconductor comprising an element of the group III nitride semiconductor of the first light-emitting constituent layer.

8. The pn-junction type compound semiconductor light-emitting device as claimed in claim 1, wherein a second barrier layer composed of an undoped boron phosphide-based semiconductor of a second conduction type is provided on the surface of the uppermost light-emitting constituent layer of the light-emitting layer.

9. The pn-junction type compound semiconductor light-emitting device as claimed in claim 8, wherein the uppermost light-emitting constituent layer of the light-emitting layer is composed of a phosphorus (P)-containing group III nitride semiconductor of first or second conduction type.

10. A method for producing a pn-junction type compound semiconductor light-emitting device, which comprises
    forming a first barrier layer composed of an undoped boron phosphide-base semiconductor of a first conduction type on a substrate composed of a crystal, and
    further forming, on the first barrier layer, a light-emitting layer of a first or a second conduction type comprising a plurality of superposed constituent layers each composed of group III nitride semiconductors having different band gaps,
    wherein the constituent layer of the light-emitting layer provided closest to the first barrier layer is a first light-emitting constituent layer composed of a group III nitride semiconductor containing phosphorus (P).

11. The method for producing a pn-junction type compound semiconductor light-emitting device as claimed in claim 10, which comprises forming an intermediate layer composed of a group III nitride semiconductor on the surface of the first barrier layer, and joining the first light-emitting constituent layer to the intermediate layer.

12. The method for producing a pn-junction type compound semiconductor light-emitting device as claimed in claim 10, which comprises forming a second barrier layer composed of an undoped boron phosphide-base semiconductor of a second conduction type on the surface of the uppermost light-emitting constituent layer of the light-emitting layer.

13. A white light-emitting diode comprising a pn-junction type compound semiconductor light-emitting device comprising a substrate composed of a crystal, a first barrier layer provided on the substrate and composed of an undoped boron phosphide-base semiconductor of a first conduction type, and a light-emitting layer of a first or a second conduction type provided on the first barrier layer and comprising a plurality of superposed constituent layers composed of group III nitride semiconductors each having a different band gap, wherein the constituent layer of the light-emitting layer provided closest to the first barrier layer is a first light-emitting constituent layer composed of a group III nitride semiconductor containing phosphorus (P).

* * * * *